United States Patent [19]

Yanagimoto

[11] Patent Number: 5,465,416
[45] Date of Patent: Nov. 7, 1995

[54] BALANCED OUTPUT HIGH-FREQUENCY TRANSDUCERS AND MIXERS USING THE SAME WITH SYMMETRICALLY LOCATED COMPONENTS

[75] Inventor: Yoshiyuki Yanagimoto, Kobe, Japan

[73] Assignee: Hewlett-Packard Company, Palo Alto, Calif.

[21] Appl. No.: 145,417

[22] Filed: Oct. 29, 1993

[30] Foreign Application Priority Data

Oct. 31, 1992 [JP] Japan ............................. 4-081503 U

[51] Int. Cl.$^6$ .................................................. H04B 1/26
[52] U.S. Cl. ......................... 455/327; 455/330; 333/246
[58] Field of Search ................................... 455/326, 327, 455/330, 331, 323, 151.2, 189.1, 190.1, 209, 313, 328; 333/26, 246, 218

[56] References Cited

U.S. PATENT DOCUMENTS 4,293,956  10/1981  Altstatt ..................................... 455/327
4,392,251   7/1983  Hallford .................................... 455/327

FOREIGN PATENT DOCUMENTS 890626  5/1992  Japan.

OTHER PUBLICATIONS

Mass, Stephen A., Microwave Mixers Second Edition, Artech House, 1993, p. 300–309.
Mini–Circuits, Mini–Circuits Catalog, 1986, vol. 1.
Hewlett Packard, HP–4396A 1.8GHz Network and Spectrum Analyzer, 1992.

Primary Examiner—Edward F. Urban
Assistant Examiner—Lee Nguyen

[57] ABSTRACT

A transducer and a mixer with a double-balanced output according to the current invention are capable of frequency conversion in a microwave band with low distortion. The transducer or the mixer has symmetry of wirings. One side of a printed circuit board has branched strip lines and a single strip line whose base portion serves as an RF input terminal, and the other side of the printed circuit board has twin-branched ground strips and a bridge-shaped ground strip. The combination of the branched strip lines and the twin-branches strips, and the combination of the single strip line and the bridge-shaped ground strip serve as a transducer. One pair of diagonal terminals of the symmetrical diode ring is connected to the base portion of the branched strip lines. The other pair of diagonal terminals is connected to the tip of the single strip line. The diode ring is connected to a transducer. One winding thereof is supplied with a local oscillator. An IF terminal is coupled to the center of the other winding thereof.

4 Claims, 6 Drawing Sheets

BALANCED OUTPUT HIGH-FREQUENCY TRANSDUCERS AND MIXERS USING THE SAME WITH SYMMETRICALLY LOCATED COMPONENTS

FIELD OF THE INVENTION

This invention generally relates to a balanced output type high-frequency transducer and a mixer in a receiver, a measuring instrument or the like which is equipped with a microwave-band frequency converter. This invention particularly relates to the transducer and the mixer in which frequency conversion in a microwave band is realized with substantially low distortion by constructing a double-balanced mixer without losing a symmetry of wirings.

BACKGROUND OF THE INVENTION

In a mixer for a microwave circuit, a microstrip line hereinafter "strip line," is formed on a printed circuit board. The strip line is used as a transducer without a high-frequency core to promote miniaturization of a device and to have a stable characteristic, etc.

FIG. 1(A) is a partial diagram of a conventional mixer circuit. The strip lines 61 and 62 are formed on the surface of a printed circuit board. However, strip lines 63 and 64 represented by oblique lines are referred to as "ground lines" and are formed on the back surface of the printed circuit board. These ground lines serve as a transducer in combination with the strip lines 61 and 62. The ground line 63 and 64 are both continuous with a ground plane GND. However, the ground line 64 is continuous with the ground plane GND only at one end where a diode ring 70 is located.

As shown in FIG. 2, the diode ring 70 comprises four diodes which are connected to one another in a ring form. Respective connection points of the diode ring 70 thereof serve as four terminals a', b', c' and d' (in this case, such that two diodes are crossed).

Now referring back to FIG. 1, the tip of the strip line 61 is connected to one end a' of the diode ring 70, and one end of the strip line 62 is connected to another terminal b' of the diode ring 70. The other end of the strip line 61 which serves as an RF input terminal is connected through a hole 85 to the tip of the ground line 64. The other end of the strip line 62 is connected through a hole 86 to the ground plane GND.

Other terminals c' and d' of the diode ring 70 of FIG. 1(A) are connected to both ends 91a and 91b of one winding of a transducer 90 as shown in FIG. 1(B). An IF terminal is drawn out of the center thereof. Both ends 92a and 92b of the other winding of the transducer 90 whose center is grounded are supplied with a local oscillator LO through a common mode choke 93.

The mixer as shown in FIG. 1(A) may be a mixer of Model No. ZFM-4212 from American Mini Circuit Co., Ltd. and can be used in a microwave band of about 4 GHz maximum frequency. Such a mixer is a double-balanced type. Although the primary conversion loss of the mixer is about 6 dB, the secondary distortion is increased due to a possible coupling between the diodes. Thus, the mixer is not usable for an application requiring low distortion. In other words, although a highly-symmetrical pattern can be formed on a printed circuit board, the diodes must be arranged in such a way as described above to result in a high distortion. On the other hand, if a diode ring is designed to substantially eliminate coupling between the diodes as shown in FIG. 2. The crossing of the wiring pattern must be required, and the symmetry of the circuit itself is lost. However, the symmetry of the diode ring itself can be maintained.

Therefore, a large number of microwave mixers adopt a single-balanced type as shown in FIG. 3. In FIG. 3, a series connection of diodes 71 and 72 are connected between the terminals 91a and 91b of one winding of the transducer 90 such as shown in FIG. 1(B). The connection point of the diodes 71 and 72 serves as an RF input terminal. However, such a single-balanced mixer has a high conversion loss of 9 dB. In addition, it is more deteriorated in Noise Figure (NF) than the double-balanced typed.

SUMMARY OF THE INVENTION

This invention overcomes the above problems. An object of the invention is to provide a balanced output from high-frequency transducer or a mixer which is a double-balanced type without losing its symmetry and realizes a frequency conversion in a microwave band with substantially low distortion.

Another object of the invention is to provide the transducer and the mixer in which a symmetrical diode ring as shown in FIG (4C) is used with keeping symmetry of wiring pattern.

In the high-frequency transducer with a balanced output according to this invention, on one side of a printed circuit board are formed (1) branched strip lines which are symmetrically bifurcated, and (2) a single strip line provided between the branched strip lines so as to be electrically insulated from the branched strip lines and extend by substantially the same length as the branched strip lines, the tip of the single strip which is opposite to the base of the branched strip lines serves as a first input/output terminal.

Further, on the other side of the printed circuit board having a ground plane formed (1) a pair of bifurcated ground strips which are located at the corresponding portions to the branched strip lines, only one end thereof located at the base side being continuous with the ground plane, (2) a bridge-shaped ground strip which is located at a position corresponding to the single-branch strip line, both ends thereof being continuous with the ground plane.

The tips of the branched strip lines penetrated through the board and are connected to the ground plane while the base portion of the single-branch strip line penetrates through the board and is connected to the tips of the twin-branched ground strip.

Further, in a symmetrical diode ring having four diodes which are connected to one another in a ring form (see FIG. 2), one terminal of the diode ring is connected to the portion of the branched strip lines, another terminal disposed diagonally to the one terminal is connected to the tip of the single-branch trip line, and the other terminals of the symmetrical diode ring serve as second input/output terminals.

In the balanced output type of high-frequency transducer thus constructed, any one of the first and second input/output terminals can be used as an input terminal (or output terminal).

The length of the strip lines are suitably set based upon a given frequency. For example, the length is determined on the basis of a length below or above a quarter of wavelength $\lambda$ of the maximum frequency of an used signal.

If the length of the strip lines is long, the coupling of the transducer in the low-frequency band is excellent. However, resonance may occur at high frequency. Therefore, the ordinary length of the strip lines is preferably as long as possible in such a range that no resonance occurs at the maximum frequency.

According to the mixer of this invention, a balanced output type of high-frequency transducer as described above is used, and the mixer is so designed that the first input/output terminal serves as a first input/output port, and the second input/output terminals are connected to one winding of a transducer whose other winding is supplied with a local oscillation signal, a second input/output port being drawn out of the center of the winding.

In this case, any of the first and second input/output ports may be used as an RF or IF port. However, in the transducer of this invention, the strip lines are grounded. Thus, it is unsuitable for a low-frequency application. Therefore, usually, the first port is used as the RF, and the second port is used as the IF port.

DETAILED DESCRIPTION OF THE INVENTION

Figure 1A:
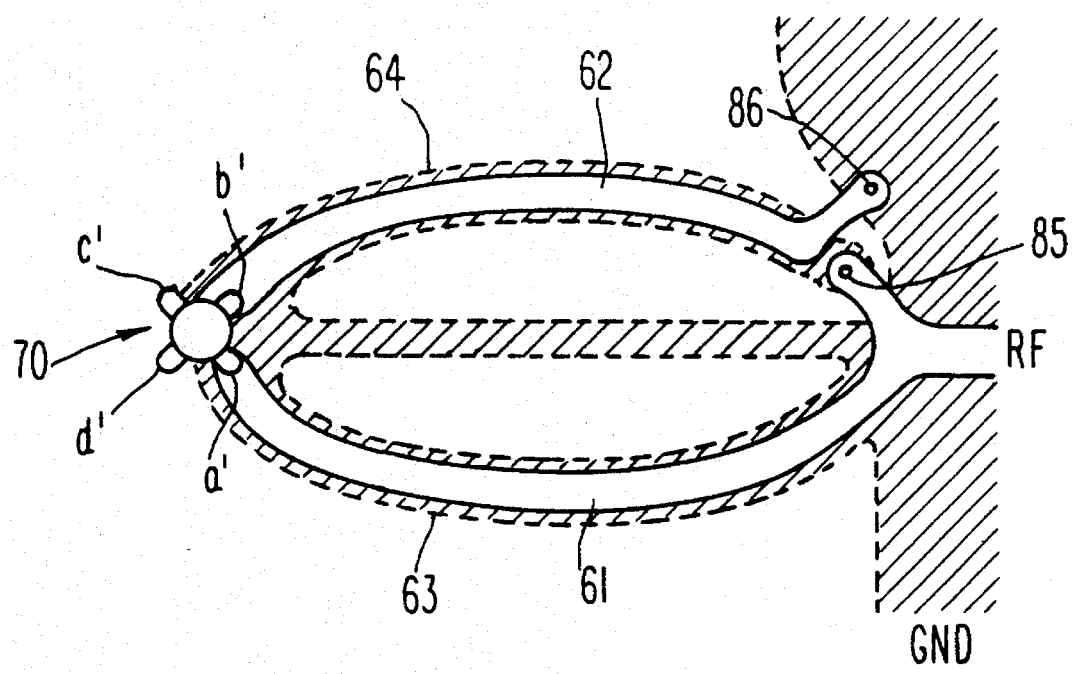
FIG. 1(A) is a partial diagram of a conventional double-balanced mixer formed on a printed circuit board.
Figure 1B:
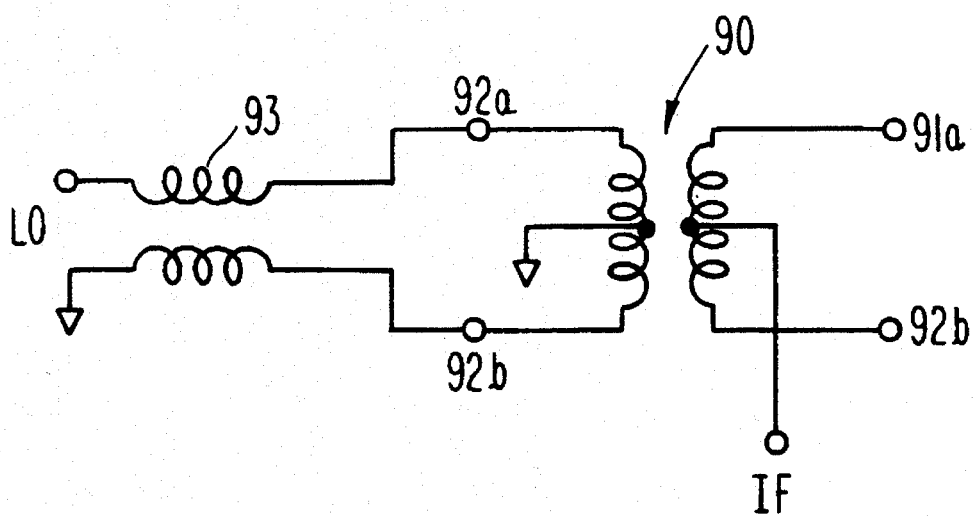
FIG. 1(B) shows a transducer portion which is connected to the circuit of FIG. 1(A).
Figure 2:
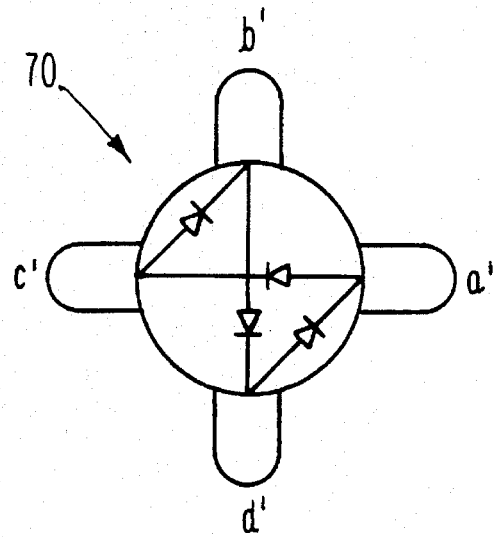
FIG. 2 shows a diode ring used in the mixer of FIG. 1(A).
Figure 3:
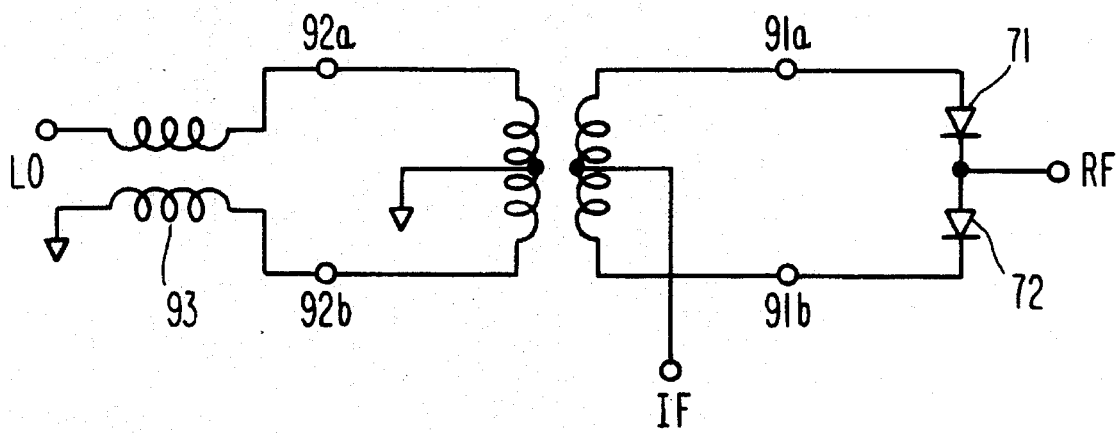
FIG. 3 shows a circuit diagram of a conventional single-balanced mixer.
Figure 4A:
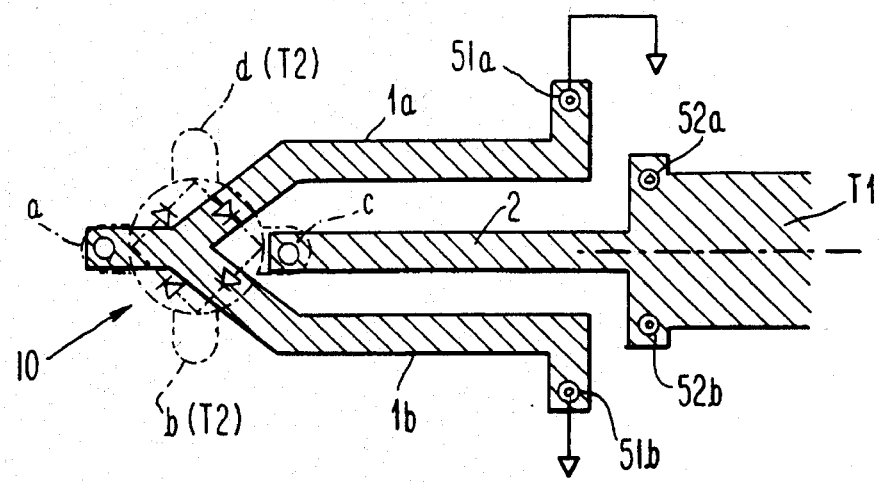
FIG. 4(A) shows a pattern of a transducer according to the invention on the one side of a printed circuit board.
Figure 4B:
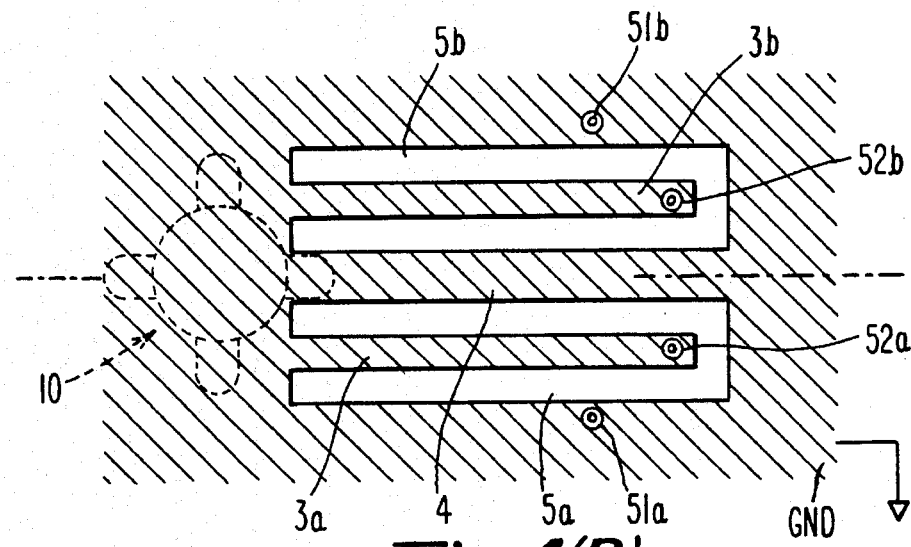
FIG. 4(B) shows a pattern on the other side of the printed circuit board.
Figure 4C:
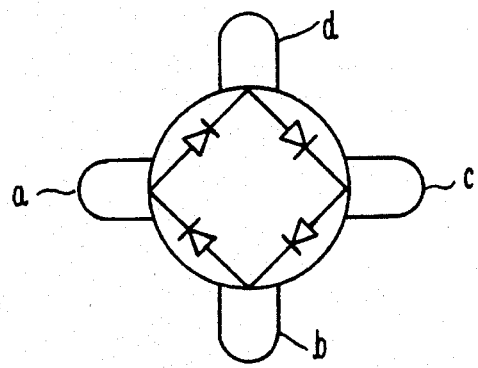
FIG. 4(C) shows a diode ring which is used in one embodiment according to the invention.

FIGS. 4(A) and 4(B) show an embodiment of a balanced output type of high-frequency transducer. While FIG. 4(A) shows strip lines on one side of a board, FIG. 4(B) shows strip lines on the other side of the board. In FIG. 4(A), branched strip lines 1a and 1b are formed on the surface of a board, and a single strip line 2 is formed between the strip lines 1a and 1b.

Still referring to FIG. 4(A), the tips of the branched strip lines 1a and 1b are respectively placed perpendicular to the body of strip lines 1a and 1b and have respective through holes 51a and 51b to be connected to a ground plane GND which is described later. The tip portion of the single strip line 2 is projected in parallel to and between the strip lines 1a and 1b. The through holes 52a and 52b are formed at the tip thereof. A base portion 1c of the branched strip lines 1a and 1b and the single-branch strip line 2 are respectively connected to the diagonally-disposed terminals a and c of the diode ring 10 as shown in FIG. 4(A).

In FIG. 4(B), twin-branched ground strips 5a and 5b are formed at the positions corresponding to the branched strip lines 1a and 1b on the back surface of the board. The ground strips 3a and 3b are continuous with the ground plane GND at one end thereof which is located near the base portion 1c of the branched strip lines 1a and 1b on the opposite surface. The tips of the twin-branched ground strips 3a and 3b respectively have through holes 52a and 52b to communicate with the base portion of the single-branch strip line 2 on the opposite surface.

Still referring to FIG. 4(B), on the back surface of the board, a bridge-shaped ground strip 4 is formed at the corresponding position to the single-branch strip line 2. Both ends of the ground strip 4 are continuous with the ground plane GND. By designing the ground plane GND pattern as described above, two U-shaped blank regions 5a and 5b are formed on the ground plane GND. In such a transducer, the base portion of the single strip line 2 serves as a first input/output terminal T1, and each of the diagonally-arranged terminals b and d of the diode ring 10 serve as a second input/output terminal T2.

Figure 5:
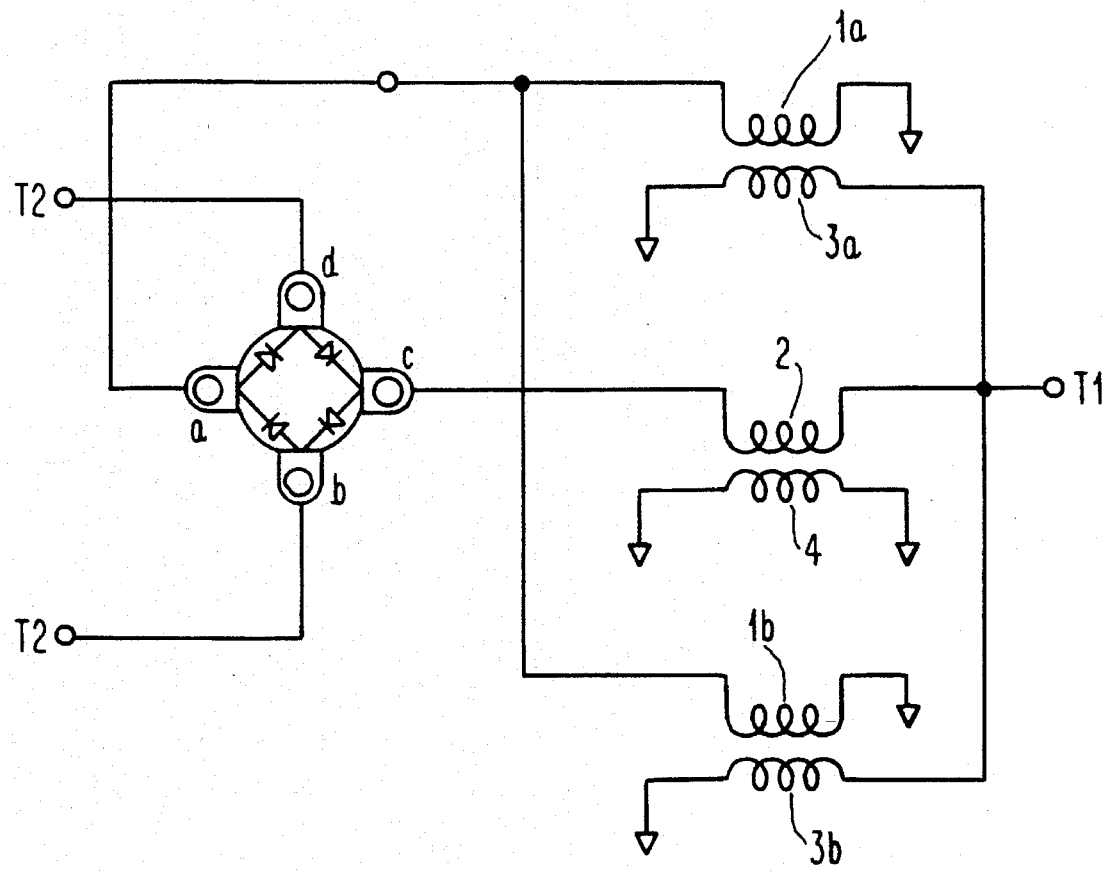
FIG. 5 is an equivalent circuit of the transducer of FIGS. 4(A) and 4(B).

FIG. 5 shows an equivalent of the whole circuit according to the current invention. The equivalent elements as in FIGS. 4(A) and (B) are represented by the same reference numerals.

Figure 6:
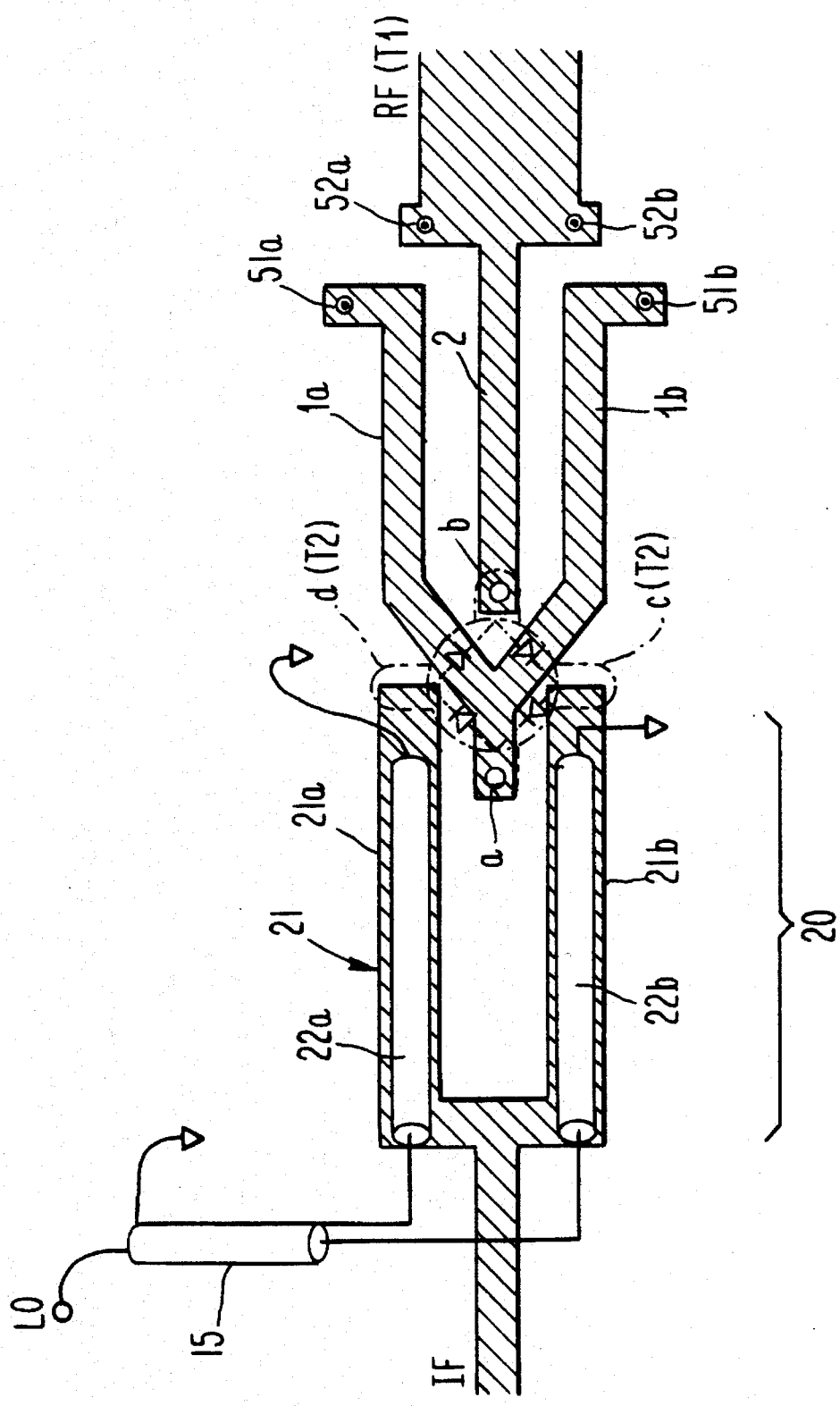
FIG. 6 shows an embodiment of the mixer according to the invention, using the transducer of FIG. 4.

FIG. 6 shows an embodiment of a mixer using the transducer as described above in FIGS. 4(A), 4(B) and 5. In FIG. 6, the second input/output terminals T2 are connected to a high-frequency transducer 20 which was previously disclosed in Japanese Patent Application No. 3-153904. A first input/output terminal T1 of a transducer 1 serves as an RF port.

The high-frequency transducer 20 is constructed as follows: An U-shaped pattern 21 is formed on the one side of a board, and two strip lines 21a and 21b are short-circuited to each other at one end side thereof. The tips of the U-shaped strip lines 21a and 21b are connected to the second input/output terminals T2 of the transducer 1. Coaxial cables 22a and 22b have substantially the same length as the strip lines 21a and 21b and have respective bare outer conductors which are respectively soldered on the strip lines 21a and 21b.

The end portions of these coaxial cable 22a and 22b at the side of the U-shaped pattern are grounded, and the end portions thereof at the short-circuited side of the U-shaped pattern are connected to a local oscillator LO through a common mode choke 15. The base portion of the strip lines 21a and 21b serves as an IF input port.

Figure 7A:
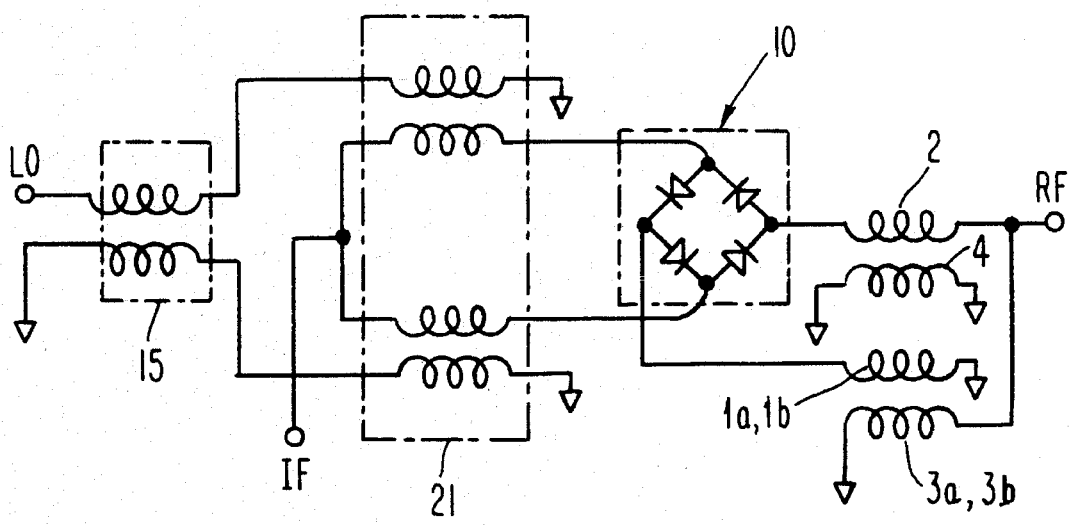
FIGS. 7(A) and 7(B) are equivalent circuits of the mixer as shown in FIG. 6.
Figure 7B:
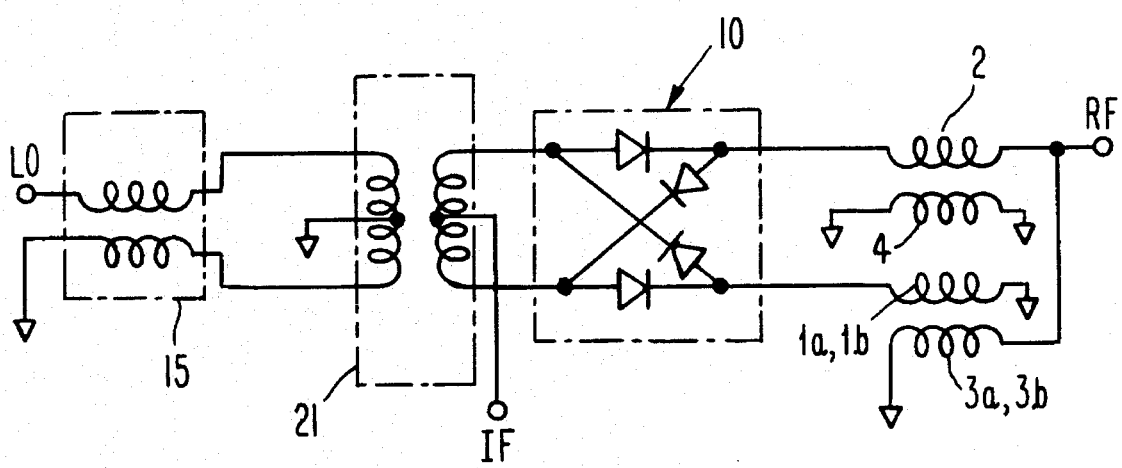

FIG. 7(A) is an equivalent circuit of FIG. 6, and FIG. 7(B) is a further-simplified equivalent circuit of FIG. (A). Using the mixer as shown in FIG. 6, 6 dB conversion loss and very low distortion are realized.

According to this invention, the double-balanced mixer is designed without losing symmetry of the wirings, thereby enabling the transducer and the mixer to accomplish extremely low distortion during the frequency conversion of the microwave band.

What is claimed is:

1. A mixer using a balanced output high-frequency transducer on a printed circuit board, a first surface of said printed circuit board having a ground plane, comprising:

branched strip lines symmetrically forked from a base thereof located on a second surface opposite to the ground plane, ends thereof distal to the base being connected to the ground plane;

a single strip line located on said second surface between said branched strip lines so as to be electrically insulated from said branched strip lines and extending substantially the same length as said branched strip lines, said single strip line having a first input/output terminal at the tip thereof distal to the base of said branched strip lines;

a pair of twin-branched ground strips located on said first surface corresponding to substantially the same location as said branched strip lines and extending from the base substantially the same length as said branched strip lines, only ends thereof proximal to the base being continuous with said ground plane while tips thereof distal to the base are connected to said single strip line at said first input/output terminal;

a bridge-shaped ground strip line located on said first surface and corresponding to said single strip line, both ends thereof being continuous with said ground plane; and a symmetrical diode ring having four diodes connected to one another in a ring form creating four terminals, wherein a first pair of diagonally placed terminals of said diode ring being connected to said base of said branched strip lines and the tip of said single strip line thereof, a second pair of diagonally placed terminals of said diode ring located outside said branched strip lines with respect to said single strip line, said first pair of diagonally placed terminals serving as said first input/output terminals, said second pair of diagonally placed terminals serving as second input/output terminals.

2. The mixer using the balanced out high-frequency transducer as claimed in claim 1, wherein said first input/output terminals serve as a first input/output port, and said second input/output terminals being connected to one winding of a transducer whose other winding is supplied with a local oscillator signal, a second input/output port being coupled to the center of said winding.

3. The mixer using balanced output high-frequency transducer as claimed in claim 1 further comprising:

a U-shaped strip line located on said second surface and connected to said second pair of diagonally placed terminals; and a pair of coaxial cables disposed on said U-shaped strip line for grounding at one end and for connecting an oscillator through a common mode choke at the other end.

4. The mixer using the balanced output high-frequency transducer as claimed in claim 3 wherein, a base portion of said U-shaped strip line serves as an IF input port.

* * * * *